United States Patent
Cheng et al.

(10) Patent No.: US 7,700,483 B2
(45) Date of Patent: Apr. 20, 2010

(54) METHOD FOR FABRICATING PIXEL STRUCTURE

(75) Inventors: Yi-Sheng Cheng, Hsinchu (TW); Chia-Chi Tsai, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 163 days.

(21) Appl. No.: 12/126,940

(22) Filed: May 26, 2008

(65) Prior Publication Data

US 2009/0061548 A1    Mar. 5, 2009

(30) Foreign Application Priority Data

Sep. 5, 2007    (TW) .............................. 96133056 A

(51) Int. Cl.
*H01L 21/44* (2006.01)
(52) U.S. Cl. ................. 438/670; 438/34; 257/E21.025; 257/E21.412
(58) Field of Classification Search ................. 438/670, 438/34, 66; 257/E21.025, E21.413, E21.412
See application file for complete search history.

(56) References Cited

U.S. PATENT DOCUMENTS

| | | | |
|---|---|---|---|
| 6,566,172 B1 | 5/2003 | Jackson et al. | |
| 6,692,997 B2 | 2/2004 | So et al. | |
| 7,601,552 B2 * | 10/2009 | Cheng et al. | ............. 438/30 |
| 2005/0048407 A1 | 3/2005 | Lee et al. | |
| 2005/0077516 A1 | 4/2005 | Lim et al. | |
| 2005/0133791 A1 | 6/2005 | Yang | |
| 2008/0213472 A1 * | 9/2008 | Song | ............. 427/162 |

FOREIGN PATENT DOCUMENTS

| | | |
|---|---|---|
| CN | 1710469 | 12/2005 |
| JP | 2002-098995 | 4/2002 |

* cited by examiner

*Primary Examiner*—Caridad M Everhart
(74) *Attorney, Agent, or Firm*—Jianq Chyun IP Office

(57) ABSTRACT

A method for fabricating a pixel structure is provided. First, a substrate having an active device formed thereon is provided. The active device has a gate, a gate dielectric layer, and a semiconductor layer having a channel, a source, and a drain region. Then, a dielectric layer is formed to cover the active device, and a photo-resist layer having a first photo-resist block and a second photo-resist block thinner than the first photo-resist block is formed on the dielectric layer. The second photo-resist block has openings above the source and the drain region, respectively. The source and the drain regions are exposed by removing part of the dielectric layer with the photo-resist layer as a mask. A second metal layer is formed after removing the second photo-resist block. A source and a drain are formed after removing the first photo-resist block. A pixel electrode connected to the drain is formed.

13 Claims, 5 Drawing Sheets

METHOD FOR FABRICATING PIXEL STRUCTURE

CROSS-REFERENCE TO RELATED APPLICATION

This application claims the priority benefit of Taiwan application serial no. 96133056, filed on Sep. 5, 2007. The entirety of the above-mentioned patent application is hereby incorporated by reference herein and made a part of this specification.

BACKGROUND OF THE INVENTION

1. Field of the Invention

The present invention relates to a method for fabricating a pixel structure. More particularly, the present invention relates to a method for fabricating a pixel structure with reduced number of photolithography and etching processes (PEPs).

2. Description of Related Art

Displays are communication interfaces between human and information, while flat panel displays are the current trend. The flat panel displays may be divided into the following categories: organic electroluiminescence displays, plasma display panels (PDPs), and TFT-LCDs, and so on. Low-temperature poly-Si TFT LCDs, advantageous in thin thickness, light weight, preferable resolution, are particularly applicable to portable electronic products requiring light-weight and power saving function.

The method for fabricating pixels having the low-temperature poly-Si TFT is complex. Generally speaking, a poly-Si layer and a first capacitor electrode are first formed on a substrate. Then, a channel region, a source region, and a drain region are defined on the poly-Si layer through an ion doping process. After that, a gate dielectric layer is formed to cover the poly-Si layer and the first capacitor electrode. Next, a gate is formed on the gate dielectric layer above the channel region of the poly-Si layer. Then, a dielectric layer is formed to cover the gate and a gate insulating layer, and a contact hole is formed in dielectric layer to expose the source region and the drain region. Afterwards, a source and a drain respectively electrically connected to the source region and the drain region via the contact holes are formed. Then, a passivation layer is formed to cover the source, the drain, and the dielectric layer, in which the passivation layer has a contact hole exposing the drain. Thereafter, a pixel electrode electrically connected to the drain via the contact hole is formed.

In view of the above, the conventional method for fabricating the pixel structure having the low-temperature poly-Si TFT mainly includes the following steps. A poly-Si layer and a first capacitor electrode are formed by a first photolithography and etching process. A gate is formed by a second photolithography and etching process. A contact hole is formed in the dielectric layer by a third photolithography and etching process. A source and a drain are formed by a fourth photolithography and etching process. A contact hole is formed in a passivation layer by a fifth photolithography and etching process. A pixel electrode is formed by a sixth photolithography and etching process. Moreover, in the method for fabricating the pixel structure of the low-temperature poly-Si TFT, two or three photolithography and etching processes are required when forming the channel region, the source region, and the drain region by the ion doping. Therefore, the conventional method for fabricating the pixels of the low-temperature poly-Si TFT generally needs about eight or nine photolithography and etching processes, and the steps of this fabricating method are complex and quite time consuming. The complex fabricating steps result in higher probability of defects in the pixels of the poly-Si TFT, and the low production yield. Furthermore, the conventional method for fabricating the pixel having the low-temperature poly-Si TFT adopts more fabricating steps and requires longer fabricating time. Therefore, the total cost of production is added due to the increase of the cost for purchasing machines and equipments and the material cost for production.

SUMMARY OF THE INVENTION

Accordingly, the present invention is directed to a method for fabricating a pixel structure for reducing the manufacturing cost.

As embodied and broadly described herein, a method for fabricating a pixel structure is provided. The method includes the following steps. First, a substrate having an active device formed thereon is provided. The active device has a gate, a gate dielectric layer, and a semiconductor layer, in which the semiconductor layer has a channel region aligned with the gate, and a source region and a drain region disposed at two sides of the channel region. Then, a dielectric layer is formed to cover the active device. After that, a photo-resist layer is formed on the dielectric layer. The photo-resist layer has a first photo-resist block and a second photo-resist block adjacent to the first photo-resist block. The second photo-resist block has openings above the source region and the drain region. The thickness of the first photo-resist block is greater than that of the second photo-resist block. Next, the source region and the drain region are exposed by removing a part of the dielectric layer by using the photo-resist layer as a mask. Afterwards, the thickness of the photo-resist layer is reduced to completely remove the second photo-resist block. Then, a second metal layer is formed to cover the first photo-resist block, the dielectric layer, and the active device. Thereafter, the first photo-resist block is removed to ablate the second metal layer on the first photo-resist block therewith. The second metal layer on the source region and the drain region respectively form a source and a drain. Then, a pixel electrode electrically connected to the drain is formed.

In an embodiment of the present invention, the method for fabricating a pixel structure further includes forming a passivation layer on the dielectric layer and the second metal layer after forming the source and the drain. The passivation layer has a contact hole exposing the drain, and the pixel electrode is electrically connected to the drain via the contact hole.

In the method for fabricating a pixel structure of the present invention, the active device is a top gate thin-film transistor (TFT). In an embodiment, the method for forming the top gate TFT includes the following steps. First, a semiconductor layer is formed on a substrate. Then, a gate dielectric layer is formed to cover the semiconductor layer. After that, a gate is formed on the gate dielectric layer above the semiconductor layer, and a source region and a drain region are formed at two ends of the semiconductor layer.

In the method for fabricating a pixel structure of the present invention, the active device is a bottom gate TFT. In an embodiment, the method for forming the bottom gate TFT includes the following steps. First, a gate is formed on a substrate. Then, a gate dielectric layer is formed on the substrate to cover the gate. After that, a semiconductor layer is formed on the gate dielectric layer above the gate, and a source region and a drain region are formed at two ends of the semiconductor layer.

In the method for fabricating a pixel structure of the present invention, the method of forming the photo-resist layer includes a half-tone mask process (HTM process) or a gray-tone mask process (GTM process).

In the method for fabricating a pixel structure of the present invention, the method for removing a part of the dielectric layer includes performing an etching process.

In the method for fabricating a pixel structure of the present invention, the method for reducing the thickness of the photo-resist layer includes performing an ashing process.

In the method for fabricating a pixel structure of the present invention, the method for removing the first photo-resist block includes an etching process, or a laser lift-off process.

In the method for fabricating a pixel structure of the present invention, the material of the semiconductor layer includes poly-silicon.

In the method for fabricating a pixel structure of the present invention, the material of the dielectric layer includes silicon oxide, silicon nitride, or an organic material.

The present invention integrates two photolithography and etching processes for fabricating the patterned dielectric layer and the source/drain and adopts less photolithography and etching processes. The method for fabricating a pixel structure according to the present invention can not only save the cost of the photo-masks, but also decrease the defects caused by the complex processes.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2A:
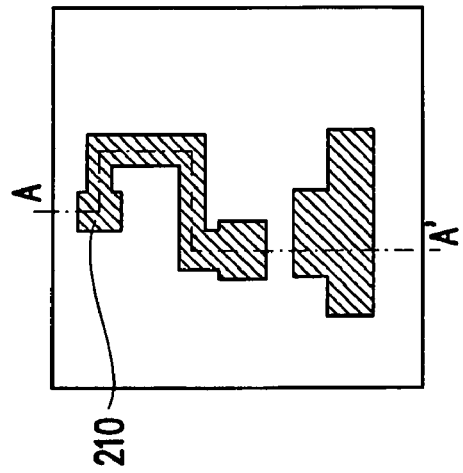
FIG. 2A is a top view of FIG. 1A.
Figure 1A:
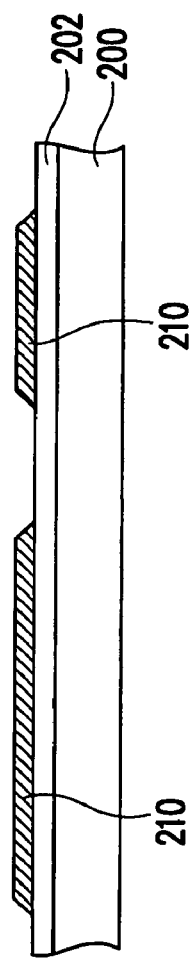
FIGS. 1A to 1I are schematic cross-sectional views of a method for fabricating a pixel structure of the present invention.

FIGS. 1A to 1I are schematic cross-sectional views for illustrating a method for fabricating a pixel structure of the present invention. Referring to FIG. 1A, first, a substrate 200 is provided, and the substrate 200 is, for example, a rigid substrate or a flexible substrate, such as, glass substrate or plastic substrate. Then, a semiconductor layer 210 is formed on the substrate 200. In this embodiment, the method for forming the semiconductor layer 210 includes the following steps. First, a semiconductor material layer (not shown) is formed on the substrate 200. Then, the semiconductor material layer is patterned by a photolithography process and an etching process, so as to form a semiconductor layer 210. FIG. 2A is a top view of FIG. 1A, and FIG. 1A is a cross-sectional view taken along a section line of A-A' of FIG. 2A. In addition, the material of the semiconductor layer 210 is, for example, poly-silicon or doped poly-silicon.

In this embodiment, before forming the semiconductor layer 210, a buffer layer 202 is optionally formed on the substrate 200 to inhibit impurities in the substrate 200 from contaminating the semiconductor layer 210 in the follow-up processes. Meanwhile, the buffer layer 202 may improve the adhesion between the semiconductor layer 210 and the substrate 200, and the material of the buffer layer 202 is, for example, silicon nitride, silicon oxide, or a combination thereof.

Figure 2B:
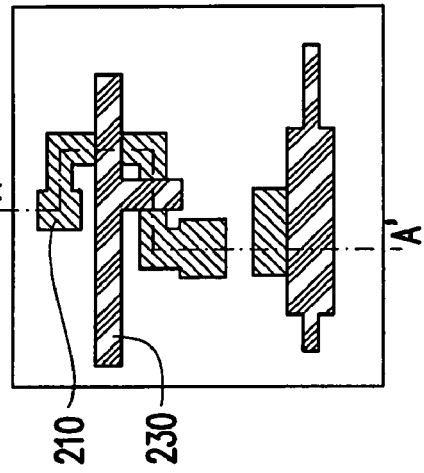
FIG. 2B is a top view of FIG. 1B.
Figure 1B:
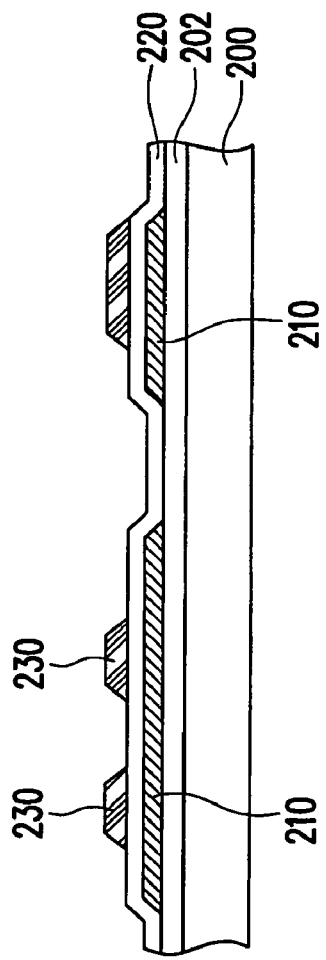

Referring to FIG. 1B, a gate dielectric layer 220 is formed on the substrate 200 to cover the semiconductor layer 210. The gate dielectric layer 220 is formed by, for example, a chemical vapor deposition (CVD) or other suitable thin film deposition techniques. The material of the gate dielectric layer 220 is, for example, a dielectric material, such as, silicon nitride, silicon oxide, silicon oxynitride, or a combination thereof. Then, a gate 230 is formed on the gate dielectric layer 220 above the semiconductor layer 210. The method for forming the gate 230 includes the following steps. First, a first metal layer (not shown) is formed on the substrate 200. Then, the first metal layer is patterned by a second photo-mask with corresponding photolithography and etching processes, so as to form a gate 230. FIG. 2B is a top view of FIG. 1B, and FIG. 1B is a cross-sectional view taken along a section line of A-A' of FIG. 2B. Furthermore, the first metal layer is formed by, for example, sputtering, evaporation, or other thin-film deposition techniques, and the first metal layer is patterned by a photolithography process and an etching process.

Figure 1C:
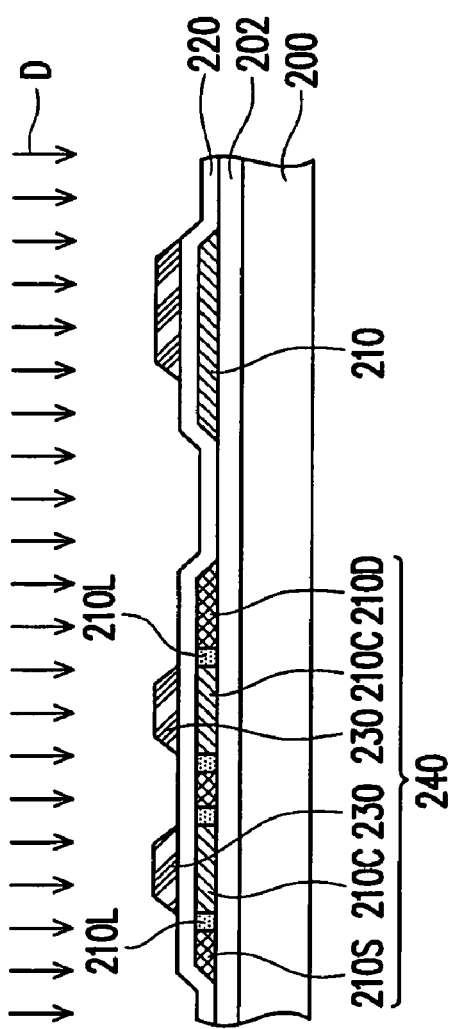
Figure 1C:
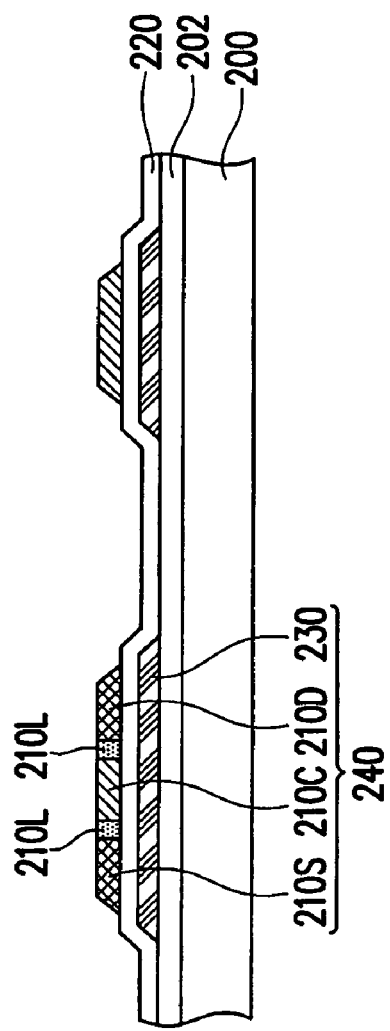

Then, referring to FIG. 1C, a doping process D is performed to make the semiconductor layer 210 have a channel region 210C aligned with the gate 230 and a source region 210S and a drain region 210D located at two ends of the semiconductor layer 210. The doping process D is a self-aligned ion doping process. In detail, the ion doping process is performed on the semiconductor layer 210 by using the gate 230 as a self-aligned mask. The ion doping method is, for example, an ion shower or an ion implantation process, and the doped ions may be P-type dopant or N-type dopant. Furthermore, in this embodiment, a lightly doped region 210L may be further formed between the source region 210S and the channel region 210C and between the drain region 210D and the channel region 210C, so as to reduce the influence of leakage current. The method for forming the lightly doped region 210L includes, for example, the following steps. First, a heavily doping process D is performed by using a photo-resist layer (not shown) as a mask, so as to form the source region 210S and the drain region 210D. Then, the photo-resist layer is removed. After that, a lightly doping process is performed by using a gate as a mask, so as to implant the dopant into the regions between the source region 210S and the channel region 210C, and between the drain region 210D and the channel region 210C.

Referring to FIG. 1C, after the channel region 210C, the source region 210S, and the drain region 210D of the semiconductor layer 210 are fabricated, the fabrication of the active device 240 is completed. In this embodiment, the active device 240 is a top gate TFT, but the present invention does not particularly limit the type of the active device 240. For example, the active device 240 may also be a bottom gate TFT, as shown in FIG. 1C'. The method for forming the bottom gate TFT includes, for example, the following steps. First, a gate 230 is formed on a substrate 200, and a buffer layer 202 is optionally formed on the substrate 200. Then, a gate dielectric layer 220 is formed on the buffer layer 202 to cover the gate 230. After that, a semiconductor layer 210 is formed on the gate dielectric layer 220 above the gate 230, and a source region 210S and a drain region 210D are formed at two ends of the semiconductor layer 210.

Figure 1D:
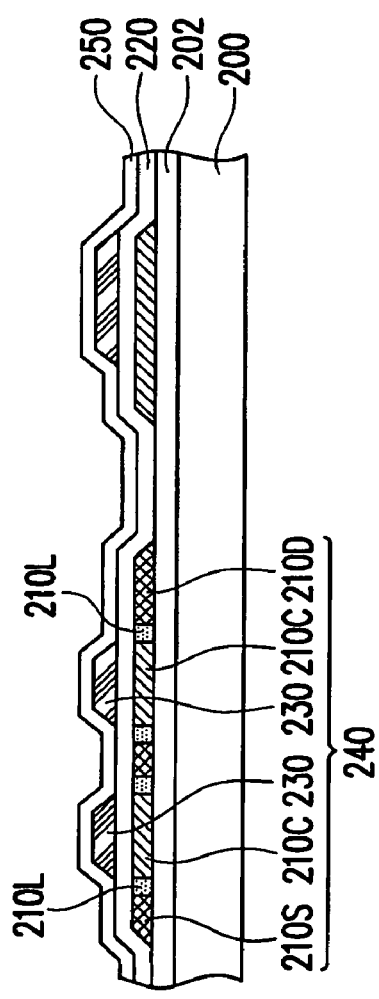

Referring to FIG. 1D, after the TFT 240 is fabricated, a dielectric layer 250 is then formed to cover the active device 240 and the gate dielectric layer 220. In this embodiment, the dielectric layer 250 is formed by chemical vapor deposition (CVD) process or other suitable film deposition techniques. The material of the dielectric layer 250 is, for example, a dielectric material, such as, silicon oxide, silicon nitride, silicon oxynitride, or a combination thereof.

Figure 2C:
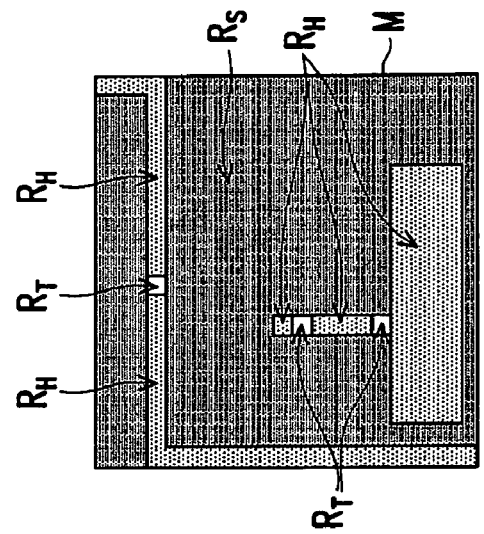
FIG. 2C shows a mask for forming a photo-resist layer.
Figure 1E:
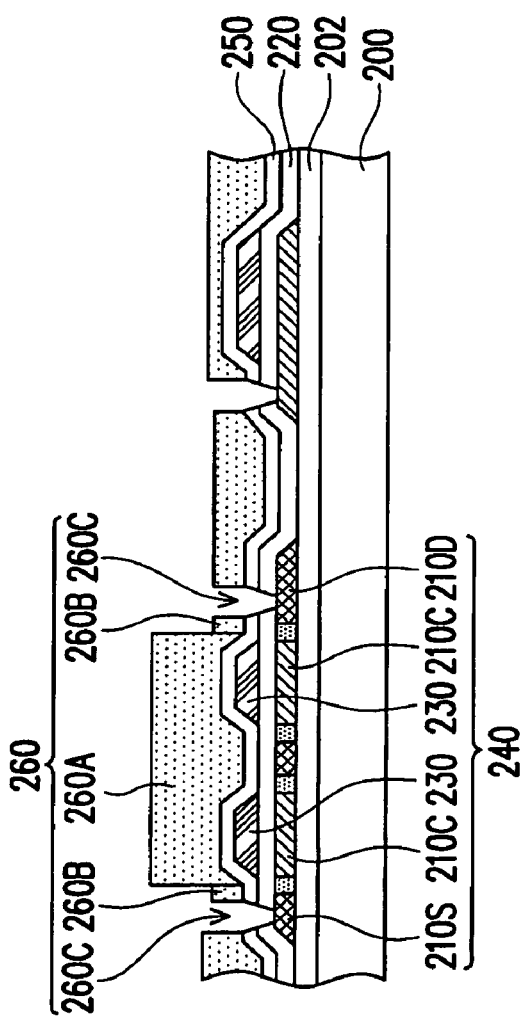

Referring to FIG. 1E, a patterned photo-resist layer 260 is formed on the dielectric layer 250, and the photo-resist layer 260 has a first photo-resist block 260A and a second photo-resist block 260B adjacent to the first photo-resist block 260A. The second photo-resist block 260B has openings 260C above the source region 210S and the drain region 210D. The thickness of the first photo-resist block 260A is greater than that of the second photo-resist block 260B. In detail, the photo-resist layer 260 is formed by, for example, a patterning process with a photo-mask M. FIG. 2C shows the photo-mask M for forming the photo-resist layer, in which only a part of the mask pattern is illustrated. Referring to FIGS. 1E and 2C, the photo-mask M has a shielding region $R_S$ corresponding to the first photo-resist block 260A, a half-transmissive region $R_H$ corresponding to the second photo-resist block 260B, and a transmissive region $R_T$ corresponding to the opening 260C. The photo-mask M is, for example, a half-tone mask, a gray-tone mask, a slit-pattern mask, or a diffraction mask. Next, as shown in FIG. 1E, a part of the dielectric layer 250 and a part of the gate dielectric layer 220 are removed by using the photo-resist layer 260 as a mask, so as to expose the source region 210S and the drain region 210D. In this embodiment, the method for removing a part of the dielectric layer 250 and a part of the gate dielectric layer 220 is a wet etching process. In other embodiments, the method for removing a part of the dielectric layer 250 and a part of the gate dielectric layer 220 is a dry etching process.

Figure 1F:
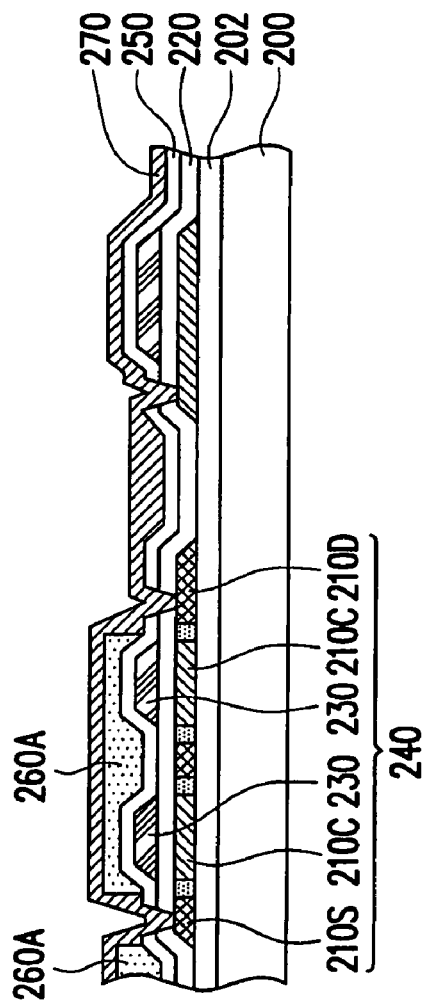

Referring to FIG. 1F, the thickness of the photo-resist layer 260 is reduced until the second photo-resist block 260B (shown in FIG. 1E) is completely removed. In this embodiment, the method for reducing the thickness of the photo-resist layer 260 includes, for example, an ashing process. Then, a second metal layer 270 is formed to cover the first photo-resist block 260A, the dielectric layer 250, and the active device 240. The second metal layer 270 is formed by, for example, sputtering, evaporation, or other film deposition techniques. The material of the second metal layer 270 is, for example, aluminum (Al), molybdenum (Mo), titanium (Ti), neodymium (Nd), nitrides thereof (such as, MoN, TiN), laminations thereof, alloys thereof, or other conductive materials.

Figure 2D:
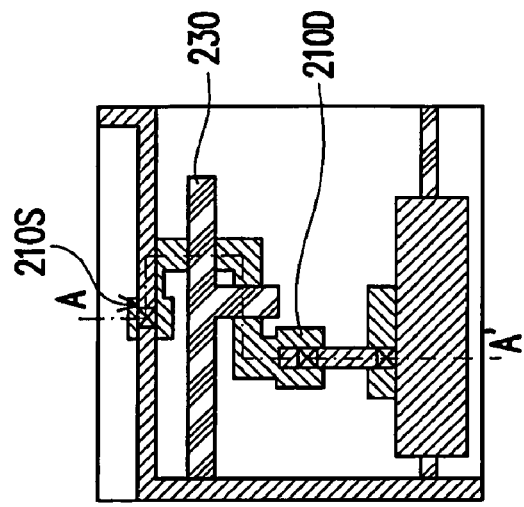
FIG. 2D is a top view of FIG. 1G.
Figure 1G:
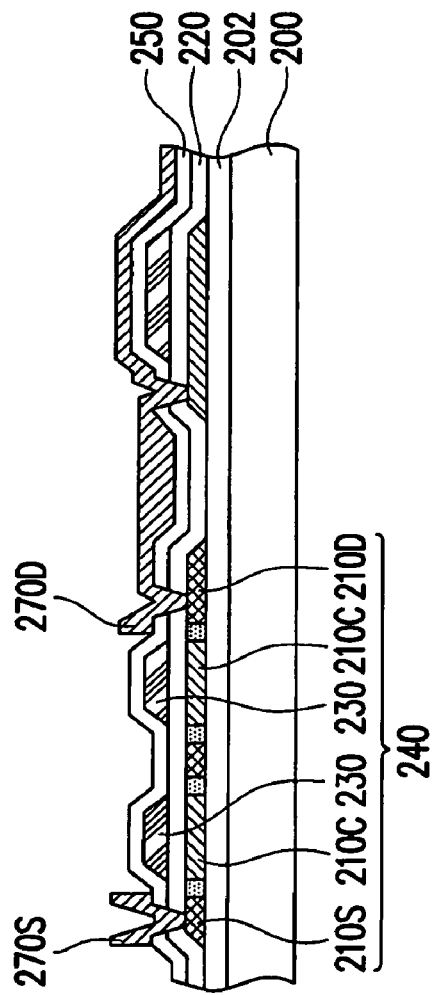

Referring to FIG. 1G, the first photo-resist block 260A is removed, and a part of the second metal layer 270 on the first photo-resist block 260A is removed therewith. The second metal layer 270 remain on the source region 210S and the drain region 210D respectively forms a source 270S and a drain 270D, as shown in FIG. 2D. FIG. 2D is a top view of FIG. 1G, and FIG. 1G is a cross-sectional view taken along a section line of A-A' of FIG. 2D. In addition, the method for removing the first photo-resist block 260A includes, for example, applying a stripper on the surfaces of the first photo-resist block 260A and the second metal layer 270, so that the bottom surface of the first photo-resist block 260A is stripped off from the surface of the dielectric layer 250. In addition, an ultrasonic oscillation may be used to enhance the stripping effect. In other embodiment, the method for removing the first photo-resist block 260A may also be an etching process or a laser lift-off process. It should be noted that the patterning of the dielectric layer 250 and the forming of the source 270S and the drain 270D are accomplished by one photo-mask with corresponding photolithography and etching processes, thereby reducing the number of photolithography and etching processes and reducing the complexity of the process.

Figure 1H:
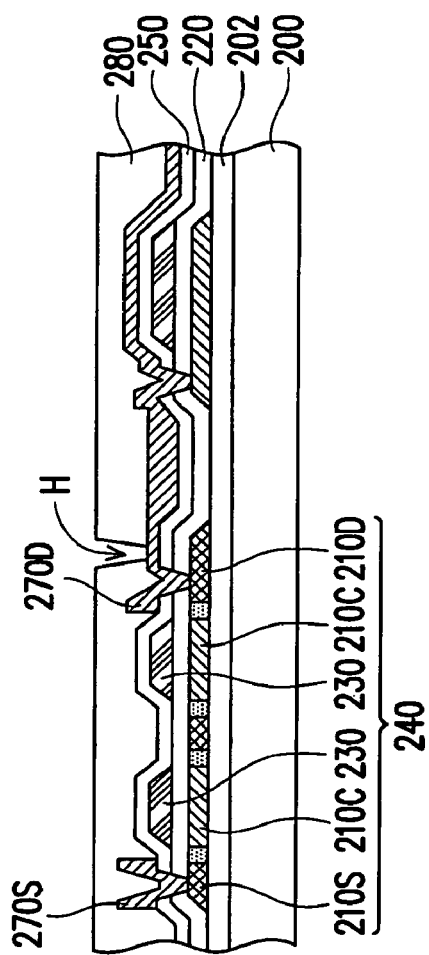

Then, referring to FIG. 1H, in this embodiment, a passivation layer 280 is formed on the dielectric layer 250 and the second metal layer 270, and the passivation layer 280 has a contact hole H exposing the drain 270D. The active device 240 is protected by the passivation layer 280, and thus the electrical characteristics the active device will not be influenced by the intrusion of moisture, and meanwhile the source 270S and the drain 270D are protected by the passivation layer 280 from being damaged. In this embodiment, the material of the passivation layer 280 may be, for example, silicon nitride or silicon oxide, and the method for forming the passivation layer 280 may be, for example, a physical vapor deposition or a chemical vapor deposition process for entirely depositing the passivation layer 280 on the substrate 200. Then, a patterning process is performed with a photolithography process and an etching process (not shown). In other embodiment, the material of the passivation layer 280 may also be an organic material, for example, a photosensitive resin.

Figure 1I:
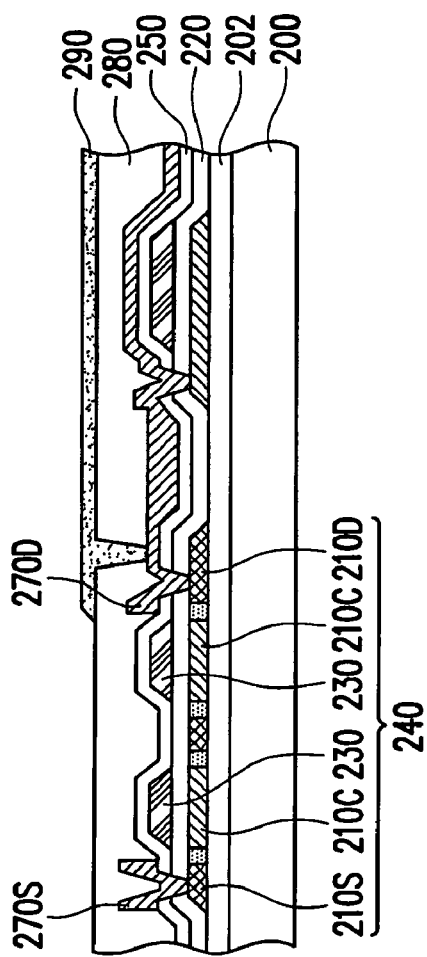

Then, referring to FIG. 1I, a pixel electrode 290 is formed on the passivation layer 280, and the pixel electrode 290 is electrically connected to the drain 270D via the contact hole H. The method for forming the pixel electrode 290 includes, for example, forming a conductive layer, such as an indium tin oxide (ITO) layer or an indium zinc oxide (IZO) layer by sputtering. Then, the pixel electrode 290 is fabricated by patterning the conductive layer with a photolithography process and an etching process (not shown). In other embodiments, the method for forming the pixel electrode 290 may also be a laser lift-off process or other suitable processes. The pixel structure may be fabricated through the steps in FIGS. 1A to 1I, and the present invention is not particularly limit the methods and steps for fabricating the active device in FIGS. 1A to 1I.

In view of the above, the present invention integrates the patterning process of the dielectric layer and the patterning process of the source and the drain. In other words, the method for fabricating a pixel structure of the present invention needs less photolithography and etching processes. The present invention has the advantages of using less photomasks, simplifying the processes, and reducing the cost. Furthermore, as the photolithography and etching processes for fabricating the pixel structure is reduced, the defects generated in the complex photolithography and etching process (such as photo-resist coating, soft-baking, hard-baking, exposure, development, photo-resist removing) when fabricating the pixel structure can be reduced, thus improving the yield rate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a pixel structure, comprising:
   providing a substrate having an active device formed thereon, wherein the active device has a semiconductor layer, a gate dielectric layer, and a gate, the semiconductor layer has a channel region, and a source region and a drain region disposed at two sides of the channel region, and the gate is aligned with the channel region;
   forming a dielectric layer to cover the active device;
   forming a patterned photo-resist layer on the dielectric layer, wherein the patterned photo-resist layer has a first photo-resist block and a second photo-resist block adjacent to the first photo-resist block, the second photo-resist block has openings above the source region and the drain region, and a thickness of the first photo-resist block is greater than that of the second photo-resist block;

removing a part of the dielectric layer to expose the source region and the drain region by using the patterned photo-resist layer as a mask;

reducing the thickness of the patterned photo-resist layer to completely remove the second photo-resist block;

forming a second metal layer to cover the first photo-resist block, the dielectric layer, and the active device;

removing the first photo-resist block to remove the second metal layer on the first photo-resist block therewith, wherein the second metal layer on the source region and the drain region respectively form a source and a drain; and forming a pixel electrode electrically connected to the drain.

2. The method for fabricating a pixel structure as claimed in claim 1, further comprising forming a passivation layer on the dielectric layer and the second metal layer after forming the source and the drain, wherein the passivation layer has a contact hole exposing the drain, and the pixel electrode is electrically connected to the drain via the contact hole.

3. The method for fabricating a pixel structure as claimed in claim 1, wherein a method for forming the patterned photo-resist layer comprises a half-tone mask process or a gray-tone mask process.

4. The method for fabricating a pixel structure as claimed in claim 1, wherein a method for removing a part of the dielectric layer comprises performing an etching process.

5. The method for fabricating a pixel structure as claimed in claim 1, wherein a method for reducing the thickness of the patterned photo-resist, layer comprises performing an ashing process.

6. The method, for fabricating a pixel structure as claimed in claim 1, wherein a method for removing the first photo-resist block comprises an etching process.

7. The method for fabricating a pixel structure as claimed in claim 1, wherein a method for removing the first photo-resist block comprises a laser lift-off process.

8. The method for fabricating a pixel structure as claimed in claim 1, wherein a material of the semiconductor layer comprises poly-silicon.

9. The method for fabricating a pixel structure as claimed in claim 1, wherein a material of the dielectric layer comprises silicon oxide, silicon nitride, or an organic material.

10. The method for fabricating a pixel structure as claimed in claim 1, wherein the active device is a top gate TFT.

11. The method for fabricating a pixel structure as claimed in claim 10 wherein a method for forming the top gate TFT comprises:

forming a semiconductor layer on the substrate;

forming a gate dielectric layer to cover the semiconductor layer;

forming a gate on the gate dielectric layer above the semiconductor layer; and forming a channel region in the semiconductor layer, and forming a source region and a drain region at two sides of the channel region.

12. The method for fabricating a pixel structure as claimed in claim 1, wherein the active device is a bottom gate TFT.

13. The method for fabricating a pixel structure as claimed in claim 12, wherein a method for forming the bottom gate TFT comprises:

forming a gate on the substrate;

forming a gate dielectric layer on the substrate to cover the gate;

forming a semiconductor layer on the gate dielectric layer above the gate; and forming a channel region in the semiconductor layer, and forming a source region and a drain region at two sides of the channel region.

* * * * *